(12) United States Patent
Baudru et al.

(10) Patent No.: US 9,279,875 B2
(45) Date of Patent: Mar. 8, 2016

(54) METHOD FOR SEARCHING A CAPACITANCE VARIATION OF A CAPACITIVE SENSOR OF A MOTOR VEHICLE

(71) Applicants: CONTINENTAL AUTOMOTIVE FRANCE, Toulouse (FR); CONTINENTAL AUTOMOTIVE GmbH, Hannover (DE)

(72) Inventors: Stephan Baudru, Pins Justaret (FR); Olivier Elie, Toulouse (FR); Maxime Cordier, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 199 days.

(21) Appl. No.: 14/186,177

(22) Filed: Feb. 21, 2014

(65) Prior Publication Data
US 2014/0239975 A1    Aug. 28, 2014

(30) Foreign Application Priority Data
Feb. 26, 2013    (FR) ..................... 13 51686

(51) Int. Cl.
*G01R 35/00*    (2006.01)
*G01R 27/26*    (2006.01)
(Continued)

(52) U.S. Cl.
CPC .......... *G01R 35/005* (2013.01); *G01R 27/2605* (2013.01); *H03K 17/955* (2013.01);
(Continued)

(58) Field of Classification Search
CPC ........ G01R 27/26; G01R 35/00; G01H 11/00; G01F 23/26; G06F 3/044
USPC ......................................................... 324/601
See application file for complete search history.

(56) References Cited

U.S. PATENT DOCUMENTS 3,931,610 A * 1/1976 Marin .................. H03K 17/975
                                                     324/678
4,820,971 A * 4/1989 Ko ........................... G01D 5/24
                                                     324/607

(Continued)

FOREIGN PATENT DOCUMENTS

DE    10 2008 052370    4/2010

OTHER PUBLICATIONS

French Search Report dated Oct. 25, 2013, corresponding to the Foreign Priority Application No. 1351686.

*Primary Examiner* — Tung X Nguyen
*Assistant Examiner* — Zannatul Ferdous
(74) *Attorney, Agent, or Firm* — Young & Thompson

(57) ABSTRACT

Method of searching for a variation in capacitance of a capacitive sensor, includes a phase of searching for variation in capacitance and, when a capacitance variation has been detected, a phase of verifying the variation in capacitance. The search phase includes a recurrent step of searching for variation in capacitance including steps of measuring the duration of a first measurement sequence and determining, according to the measured duration, whether a first predefined detection criterion for variation in capacitance is verified. The verification phase includes steps of measuring the duration of a second measurement sequence and determining, according to the measured duration, whether a second predefined detection criterion for variation in capacitance is verified. The first measurement sequence has a reference duration less than that of the second measurement sequence, and the verification phase includes, when the second detection criterion is not verified, a step of updating the first detection criterion.

10 Claims, 2 Drawing Sheets

(51) Int. Cl.
*H03K 17/955* (2006.01)
*H03K 17/96* (2006.01)

(52) U.S. Cl.
CPC .... *H03K17/962* (2013.01); *H03K 2217/94026* (2013.01); *H03K 2217/960705* (2013.01); *H03K 2217/960715* (2013.01)

(56) References Cited

U.S. PATENT DOCUMENTS 5,554,937 A * 9/1996 Sanders ............. G01R 27/2605
324/664
2005/0068712 A1 3/2005 Schulz et al.

* cited by examiner

METHOD FOR SEARCHING A CAPACITANCE VARIATION OF A CAPACITIVE SENSOR OF A MOTOR VEHICLE

FIELD OF THE INVENTION

The present invention belongs to the field of presence sensors, and more particularly relates to a method for searching a capacitance variation of a capacitive sensor.

The present invention finds a particularly advantageous, although in no way restrictive, application for capacitive sensors integrated into the door handles of motor vehicles.

BACKGROUND OF THE INVENTION

These days, many motor vehicles incorporate capacitive sensors. In particular, it is known for a capacitive sensor to be integrated into the handle of a (side or trunk) door of a motor vehicle in order to search for the presence of said motor vehicle users hand in the proximity of said handle. Once the hand is detected, an authentication protocol by radio means is, for example, implemented between the motor vehicle and a key of said motor vehicle, carried by the user. In the event of successful authentication by radio means, the door of the motor vehicle is, for example, automatically unlocked, without the user having had to manipulate said key.

Conventionally, searching for the presence of the users hand in the proximity of the handle equipped with an inductive sensor takes place by searching for a variation in the capacitance of the capacitive sensor. What happens is that the presence of a hand in the proximity of the capacitive sensor causes a variation in the capacitance thereof, more particularly an increase in said capacitance of said capacitive sensor.

For example, it is known to measure the duration of a predefined sequence of charges/discharges of the capacitive sensor with a current of predefined constant intensity. For example, the capacitive sensor is charged until the voltage at its terminals reaches a predefined value Vmax, then discharged until the voltage at its terminals reaches a predefined value Vmin, then charged again until the voltage at its terminals reaches the value Vmax, etc.

The sequence of charges/discharges comprises a predefined number of such successive charges/discharges. Since the charges/discharges of said capacitive sensor take place with a current of predefined constant intensity, the duration of the sequence of charges/discharges depends in principle only on the capacitance of said capacitive sensor. Accordingly, by recurrently measuring the duration of said sequence of charges/discharges, it is possible to detect the presence of the users hand in the proximity of the handle when the measured duration of the sequence of charges/discharges increases significantly.

In principle, the greater the number of charges/discharges in the sequence of charges/discharges the more sensitive the capacitive sensor. Accordingly, it is possible, by increasing the number of charges/discharges in the sequence of charges/discharges, to increase the range of the capacitive sensor (distance from which the users hand can be detected) and/or to reduce the probability of a false alarm (probability of detecting the presence of a hand in the absence of a hand in the proximity of said capacitive sensor) for a given range.

The number of charges/discharges in the sequence of charges/discharges is generally predefined so as to ensure that the range of the capacitive sensor is greater than a predefined minimum range and, for this minimum range, a probability of false alarm less than a maximum predefined probability.

However, it is understood that the more the number of charges/discharges in the sequence of charges/discharges increases, the greater the electrical consumption of the capacitive sensor.

For reducing the electrical consumption of the capacitive sensor, it is known to choose the number of charges/discharges in the sequence of charges/discharges so that the predefined minimum range is ensured, but with a probability of false alarm which may be greater than the predefined maximum probability. Searching for variation in capacitance of the capacitive sensor is then broken down into two phases: a phase of searching for variation in capacitance and, when a variation in capacitance has been detected, a phase of verifying said variation in capacitance.

During the search phase, the duration of the sequence of charges/discharges is measured. When a detection criterion is verified, e.g. when the measured duration is much higher than a reference duration of said sequence of charges/discharges in the absence of a hand in the proximity of said capacitive sensor, the verification phase is executed. The verification phase comprises several successive sequences of charges/discharges, closely spaced in time and identical to the sequence of charges/discharges of the search phase, of which the durations are measured. The same detection criterion is evaluated for each of the durations measured, and the detection of variation in capacitance is confirmed when said detection criterion is verified for each of the durations measured during the verification phase. It is understood therefore that the verification phase, due to the fact that it is based on several consecutive evaluations of the detection criterion, enables the probability of false alarm to be significantly reduced.

In order to further reduce the electrical consumption of the capacitive sensor, it is also known to gradually reduce the frequency of the sequences of charges/discharges during the search phase (standby mode of the capacitive sensor), to the detriment, however, of the responsiveness with which the capacitive sensor may detect the presence of a hand.

However, there is still a need to reduce the electrical consumption of the capacitive sensor during the search phase. This is because a capacitive sensor in a motor vehicle handle spends much more time in searching for the presence of a hand than in actually verifying the presence of a hand. In addition, when the motor vehicle is stopped, the electrical consumption of the capacitive sensor is directly taken from the motor vehicle battery.

SUMMARY OF THE INVENTION

The aim of the present invention is to remedy all or part of the limitations of the prior art solutions, particularly those described above, by providing a solution which would enable the electrical consumption of the capacitive sensor to be reduced, or the responsiveness of said capacitive sensor to be increased compared with the prior art solutions.

In addition, the aim of the present invention is to provide such a solution while ensuring that the range of the capacitive sensor is greater than a predefined minimum range and that the probability of false alarm, for this minimum range, is less than a predefined maximum probability.

For this purpose, and according to a first aspect, the invention relates to a method of searching for a capacitance variation of a capacitive sensor, said method comprising a phase of searching for a variation in capacitance and, when a variation in capacitance has been detected, a phase of verifying the variation in capacitance. The search phase comprises a recurrent step of searching for a variation in capacitance comprising steps of measuring the duration of a first predefined sequence of charges/discharges of said capacitive sensor, known as the 'first measurement sequence', and of determining, according to the measured duration, whether a first predefined detection criterion for variation in capacitance is verified. The verification phase comprises steps of measuring the duration of a second predefined sequence of charges/discharges of said capacitive sensor, known as the 'second measurement sequence', and of determining, according to the measured duration, whether a second predefined detection criterion for variation in capacitance is verified. In addition, the first measurement sequence is, in the absence of variation in capacitance, of a duration, known as the 'reference duration', less than the reference duration of the second measurement sequence, and the verification phase comprises, when the second detection criterion is not verified, a step of updating the first detection criterion.

Thus, it is understood that different sequences of charges/discharges of the capacitive sensor are considered during the search phase and during the verification phase. During the search phase, a first sequence of charges/discharges is considered, known as the 'first measurement sequence', and during the verification phase, a second sequence of charges/discharges is considered, known as the 'second measurement sequence'. The second measurement sequence is of a reference duration greater than that of the first measurement sequence. In other words, the number of charges/discharges in the first measurement sequence is less than that of the second measurement sequence. The number of charges/discharges in the first measurement sequence can be set independently of that of the second measurement sequence, and chosen to be low just to ensure that the range of the capacitive sensor during the search phase is greater than a predefined minimum range. The number of charges/discharges in the second measurement sequence, and more generally the verification phase, is, for example, configured so as to ensure that the probability of false alarm after the verification phase is, for said minimum range, less than a predefined maximum probability.

It is, therefore, understood that the search phase can be optimized to ensure a very high probability of detection of any hand located at a distance from the sensor greater than the minimum range of the capacitive sensor. On the other hand, the probability of false alarm at the conclusion of the search phase may be high. In order to avoid the verification phase being executed too often in the absence of a hand in the proximity of the capacitive sensor, the first detection criterion, used during the search phase, is advantageously updated according to the result of the verification phase. In other words, the first detection criterion is dynamic and is updated so as to make it more constraining when the second detection criterion, used during the verification phase, is not verified.

In particular modes of implementation, the method of searching for a variation in capacitance may further comprise one or more of the following characteristics, taken in isolation or according to all the technically possible combinations.

In a particular mode of implementation, during the step of updating, the first detection criterion is modified when the second detection criterion is not verified during a predefined number of consecutive verification phases.

In a particular mode of implementation, the first detection criterion being verified when the measured duration of the first measurement sequence or the difference between said measured duration and the reference duration of the first measurement sequence is greater than a threshold value, the modification of said first detection criterion during the verification phase consists in an increase of said threshold value.

In a particular mode of implementation, when the first detection criterion has been modified during the verification phase, the search phase also comprises a step of updating said first detection criterion.

In a particular mode of implementation, during the step of updating the search phase, the first detection criterion is modified when the previous first detection criterion, used before modification during the verification phase, is not verified a predefined number of consecutive times.

In a particular mode of implementation, the first detection criterion being verified when the measured duration of the first measurement sequence or the difference between said measured duration and the reference duration of the first measurement sequence is greater than a threshold value, the modification of said first detection criterion during the search phase consists in an increase of said threshold value.

In a particular mode of implementation, the verification phase search step is executed periodically with a period T1, and the verification phase measurement step comprises measuring the duration of several second measurement sequences executed periodically with a period T2 less than the period T1, the evaluation of the second detection criterion taking place according to the respective measured durations of the different second measurement sequences.

According to a second aspect, the present invention relates to a motor vehicle comprising a capacitive sensor integrated into a door handle and means configured for searching for a variation in capacitance of said capacitive sensor in accordance with a method according to the invention.

BRIEF DESCRIPTION OF THE DRAWINGS

The invention will be better understood on reading the following description, given by way of a non-restrictive example, and referring to the figures, in which.

DETAILED DESCRIPTION OF THE INVENTION

In these figures, identical references from one figure to another designate identical or similar elements. For reasons of clarity, the elements depicted are not to scale, unless stated otherwise.

Figure 1:
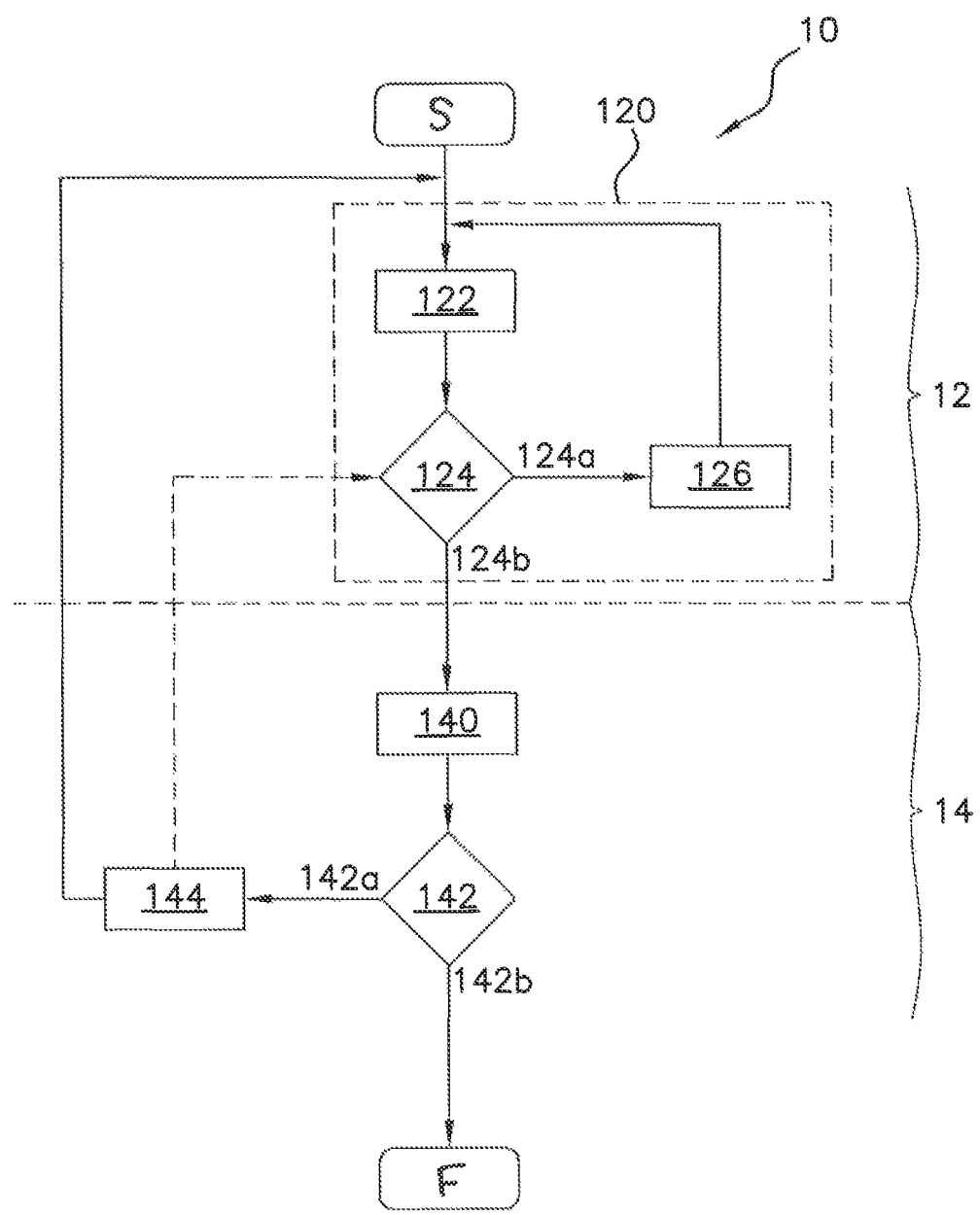
FIG. 1: is a diagram depicting the main steps of an example of implementation of a method of searching for a variation in capacitance of a capacitive sensor.

FIG. 1 schematically depicts the main steps of a preferred mode of implementation of a method 10 of searching for a variation in capacitance of a capacitive sensor.

The remainder of the description will non-restrictively describe the case of a capacitive sensor integrated into a (side or trunk) door handle of a motor vehicle. Said capacitive sensor is implemented for detecting the presence of a hand in the proximity of said handle. What happens, as previously stated, is that the presence of a hand in the proximity of such a handle causes a variation in the capacitance of the capacitive sensor, more particularly an increase in said capacitance.

As illustrated in FIG. 1, the method 10 of searching for a variation in capacitance, once started (step S), comprises two phases:

a phase 12 of searching for a variation in capacitance of the capacitive sensor, when a variation in capacitance has been detected during the search phase 12: a phase 14 of verifying the variation in capacitance of said capacitive sensor.

The search phase 12 mainly comprises a step 120 of searching for a variation in capacitance, which is executed recurrently. Step 120 of searching for a variation in capacitance is, for example, executed in a substantially periodic way with a period T1. In an advantageous mode of implementation, the period T1 varies over time between a minimum value T1min and a maximum value T1max, and increases, for example, progressively from the value T1 min to the value T1max as long as there is no variation in capacitance detected. When a variation in capacitance is detected, the period T1 may, for example, resume the value T1min during the next search phase 12.

Nothing, however, excludes following other examples in having a fixed period T1 over time or having a step 120 of searching for a variation in capacitance executed in a recurrent but non-periodic way.

As illustrated in FIG. 1, step 120 of searching for a variation in capacitance comprises a step 122 of measuring the duration of a first predefined sequence of charges/discharges of the capacitive sensor, known as the 'first measurement sequence'.

The first measurement sequence comprises a predefined number of charges/discharges of the capacitive sensor. Said number of charges/discharges is preferably chosen previously, by simulation or experimentation, as being the lowest number able to ensure the detection of the presence of a hand located within an area of interest around the capacitive sensor, determined by a desired predefined minimum range from said capacitive sensor, i.e. between 2 and 8 mm.

Then, step 120 of searching for a capacitance variation comprises a step 124 of determining, according to the measured duration Tmes1, whether a first predefined detection criterion for a capacitance variation is verified. When the first detection criterion is not verified (reference 124a in FIG. 1), the verification phase 14 is not executed. When the first detection criterion is verified (reference 124b in FIG. 1), the verification phase 14 is executed.

Figure 2:
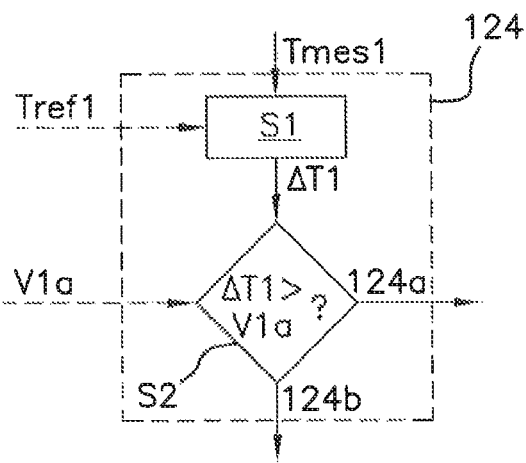
FIG. 2: is a diagram depicting in more detail a step of searching for a variation in capacitance in the method depicted in FIG. 1, FIGS. 3a, 3b and 3c: are temporal diagrams illustrating the implementation of the method of searching for a variation in capacitance depicted in FIG. 1.

FIG. 2 illustrates a non-restrictive example of first detection criterion.

As noted previously, the number of charges/discharges in the first measurement sequence being known, and the charges/discharges of said capacitive sensor taking place with a current of known constant intensity, the duration of the first measurement sequence Tmes1 depends mainly on the capacitance of said capacitive sensor. Thus, it is possible to determine a priori, by simulation or experimentation, a reference duration Tref1 of the first measurement sequence, representative of the duration of said first measurement sequence in the absence of a hand in the proximity of the motor vehicle handle. It is further possible to determine a priori, by simulation or experimentation, a threshold value V1a representative of an increase in the measured duration Tmes1 with respect to the reference duration Tref1 capable of being induced by the presence of a hand within the area of interest.

Step 124 of determining whether the first detection criterion is verified then comprises a step S1 of comparing the measured duration Tmes1 with the reference duration Tref1 which consists, in the example illustrated in FIG. 2, in calculating a difference $\Delta T1$ between the measured duration Tmes1 and the reference duration Tref1. Step 124 of determining whether the first detection criterion is verified then comprises a step S2 of determining whether the difference $\Delta T1$ is greater than the threshold value V1a. When the difference $\Delta T1$ is not greater than the threshold value V1a (reference 124a in FIG. 2), the first detection criterion is not verified. When the difference $\Delta T1$ is greater than the threshold value V1a (reference 124b in FIG. 2), the first detection criterion is verified and the verification phase 14 is executed.

As illustrated in FIG. 1, the verification phase 14 comprises steps:
  140 of measuring the duration of a second predefined sequence of charges/discharges of said capacitive sensor, known as the 'second measurement sequence',
  142 of determining, according to the measured duration Tmes2, whether a second predefined detection criterion for a capacitance variation is verified.

The remainder of the description will non-restrictively describe the case where the verification phase 14 measurement step 140 comprises the execution and measurement of a single second measurement sequence. Nothing excludes, following other examples, measuring the duration of several second measurement sequences, for example executed periodically with a period T2 preferably less than the period T1. In such a case, the evaluation of the second detection criterion takes place according to the respective measured durations of the different second measurement sequences. According to yet other examples not described in detail, it is possible to measure, in addition to the duration of the second measurement sequence, the duration of one or more other sequences of charges/discharges other than the second measurement sequence.

According to the invention, the second measurement sequence comprises a predefined number of charges/discharges of the capacitive sensor, greater than the number of charges/discharges in the first measurement sequence, so that the reference duration Tref2 of the second measurement sequence is greater than the reference duration Tref1. For example, the number of charges/discharges in the second measurement sequence is at least four times greater than that in the first measurement sequence. Thus, the probability of false alarm, within the area of interest, is therefore lower with the second measurement sequence than with the first measurement sequence.

The number of charges/discharges in the second measurement sequence is, for example, chosen previously, by simulation or experimentation and takes into account the second detection criterion, so as to ensure that the probability of false alarm within the area of interest is less than a predefined maximum probability.

During step 142 of determining whether the second detection criterion is verified, the measured duration Tmes2 is, for example, compared with the reference duration Tref2, in a manner similar to what has been described in reference to FIG. 2 for the first detection criterion. For example, a difference $\Delta T2$ is calculated, between the measured duration Tmes2 and the reference duration Tref2, and compared with a predefined threshold value V2.

When the second detection criterion is verified (reference 142b in FIG. 1), the detection of a variation in capacitance of the capacitive sensor is confirmed and the verification phase 14 ends (step F).

When the second detection criterion is not verified (reference 142a in FIG. 1), i.e. when the detection is not confirmed and the detection during the search phase 12 corresponds to a false alarm, said verification phase 14 comprises a step 144 of updating the first detection criterion used during said search phase 12.

According to the invention, step 144 of updating the verification phase 14 is aimed at making the first detection criterion more constraining in order to reduce the probability of false alarm at the conclusion of the search phase 12.

It should be noted, however, that the first detection criterion is not necessarily modified at each execution of step 144 of updating the verification phase 14. For example, the first detection criterion may only be modified when the second detection criterion is not verified during a predefined number of consecutive verification phases 14, e.g. two consecutive verification phases 14.

In considering the first detection criterion described with reference to FIG. 2, the modification of said first detection criterion, during step 144 of updating the verification phase 14, consists, for example, in an increase in the considered threshold value. For example, the threshold value V1*a* is replaced by a threshold value V1*b* greater than V1*a*. The threshold value V1*b* is, for example, a predefined value or a value calculated according to the differences ΔT1, greater than V1*a*, calculated for the measured durations of the previous first measurement sequences. For example, the threshold value V1*b* is equal, for example, to a percentage of the average of said differences ΔT1.

In particular modes of implementation, the search phase 12 also comprises, when the first detection criterion has been modified during the verification phase 14, a step 126 of updating the first detection criterion. Step 126 of updating the search phase 12 is aimed at making the first detection criterion less constraining, if necessary for increasing the probability of detection.

In a particular mode of implementation, step 126 of updating the search phase comprises the evaluation of the previous detection criterion, used before modification during the verification phase 14. In the example described above, this means verifying, during updating step 126, whether the calculated difference ΔT1 is greater than the threshold value V1*a*, used before replacement by the threshold value V1*b*.

It should be noted, however, that the first detection criterion is not necessarily modified at each execution of step 126 of updating the search phase 12. For example, the first detection criterion may only be modified when the previous first detection criterion is not verified during a predefined number of consecutive search steps 120, e.g. four consecutive search steps 120.

The modification of said first detection criterion, during step 126 of updating the search phase 12, consists, for example, in a reduction in the threshold value considered. For example, the threshold value V1*b* is replaced by the threshold value V1*a*.

Figure 3A:
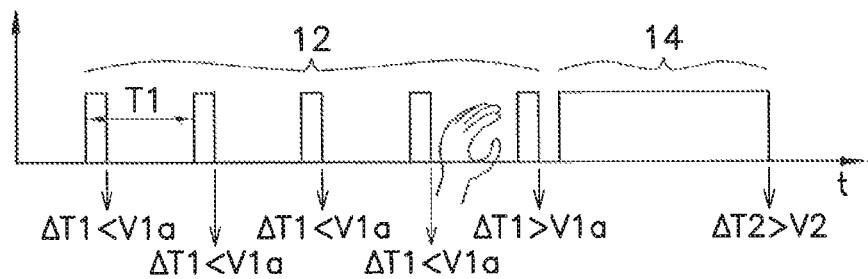
Figure 3B:
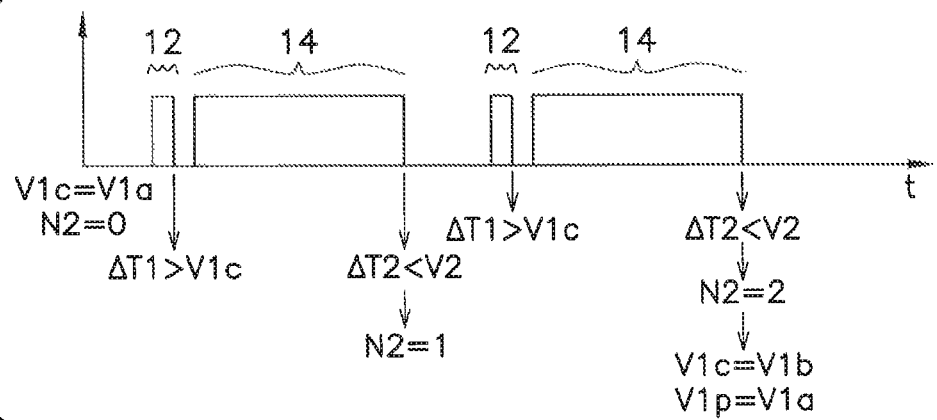
Figure 3C:
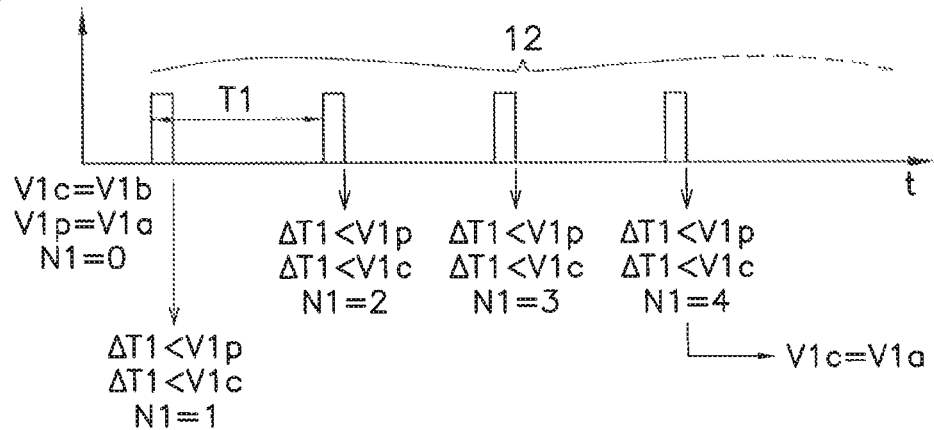

FIGS. 3*a* to 3*c* depict temporal diagrams illustrating the implementation of the method 10 of searching for a variation in capacitance illustrated in FIG. 1.

FIG. 3*a* depicts the normal operation of the method 10 of searching for a variation in capacitance. The search phase 12 is first executed, and the search step 120 is executed periodically, with a period T1. During the first four executions (for example, this number being programmable) of the search step 120, the first detection criterion is not verified, the calculated difference ΔT1 being less than the threshold value V1*a*. After the fourth execution of the search step 120, a hand enters the area of interest around the capacitive sensor. During the fifth execution of the search step 120, the first detection criterion is verified, and the verification phase 14 is executed. During the verification phase 14, the second detection criterion is verified and the detection is confirmed (the difference ΔT2 being greater than the threshold value V2).

FIG. 3*b* depicts operation in the case where a detection is not confirmed during the verification phase 14. In FIG. 3*b*, it is considered that the first detection criterion is only modified, during step 144 of updating the verification phase 14, if the second detection criterion is not verified during two consecutive verification phases 14. In FIG. 3*b*, 'V1*c*' designates the current threshold value of the first detection criterion, and 'V1*p*' designates the threshold value of the previous first detection criterion, used before modification during the verification phase 14. As illustrated in FIG. 3*b*, the search phase 12 is first executed with a threshold value V1*c* equal to the value V1*a*. The first detection criterion is verified during the first execution of the search step 120, without, however, a hand entering the area of interest. The verification phase 14 is then executed. The second detection criterion is not verified, and a counter N2 of the number of consecutive verification phases 14 for which the second detection criterion has not been verified, initially set to zero, is incremented to one. The search phase 12 is repeated, and the first detection criterion is again verified during the first execution of the search step 120, without, however, a hand entering the area of interest. The verification phase 14 is then executed. The second detection criterion is again not verified, and the counter N2 is incremented to two (for example). The threshold value V1*c* is modified and replaced by the value V1*b*, while the threshold value V1*p* takes the value V1*a*.

FIG. 3*c* depicts operation in the case where the first detection criterion has been modified during the verification phase 14, assuming:
  that the threshold value V1*c* is equal to the value V1*b*,
  that the threshold value V1*p* is equal to the value V1*a*,
  that the first detection criterion is only modified, during step 126 of updating the search phase 12, if the second detection criterion is not verified during four consecutive search phases 120.

The search phase 12 is first executed. The previous first detection criterion is not verified (and therefore nor is the first detection criterion in progress), and a counter N1 of the number of consecutive search phases 120 for which the previous first detection criterion has not been verified, initially set to zero, is incremented by one. The same applies to the next three executions of the search step 120 so that, at the conclusion of the fourth execution of the search step 120, the counter N1 is equal to four. The first detection criterion is then modified during step 126 of updating the search phase 12, and the threshold value V1*c* to be used again takes the value V1*a*.

The present invention also relates to a motor vehicle comprising a capacitive sensor integrated into a door handle and means configured for searching for a variation in capacitance of said capacitive sensor in accordance with a method according to the invention. Said means preferably comprise a processor and an electronic memory in which a computer program product is stored, in the form of a set of program code instructions which, when they are executed by the processor, implement all or part of the steps of the method 10 of searching for a variation in capacitance. In a variant, said means comprise programmable logic circuits, of the FPGA, PLD, etc. type, and/or application-specific integrated circuits (ASICs), suitable for implementing all or part of the steps of said method 10 of searching.

More generally, it should be noted that the modes of implementation considered above have been described by way of non-restrictive examples, and that variants are therefore conceivable.

In particular, the present invention has been described considering two threshold values V1*a* and V1*b*. Following other examples, nothing excludes considering a number of threshold values greater than two.

The foregoing description clearly illustrates that through its various characteristics and their advantages, the present invention achieves the objectives that were set. In particular, it is understood that it is possible, thanks to the reduction in the reference duration Tref1 of the first measurement sequence compared with the prior art solutions, to reduce the electrical consumption (keeping the same period T1 as in the prior art solutions) and/or to increase the responsiveness of the capacitive sensor (by reducing the period T1 compared with the prior art solutions).

The invention claimed is:

1. A method (10) for searching a capacitance variation of a capacitive sensor, said method comprising a phase (12) of searching for a variation in capacitance and, when a variation in capacitance has been detected, a phase (14) of verifying the variation in capacitance, the search phase (12) comprising a recurrent step (120) of searching for a variation in capacitance comprising steps (122) of measuring the duration of a first predefined sequence of charges/discharges of said capacitive sensor, known as the 'first measurement sequence', and (124) of determining, according to the measured duration, whether a first predefined detection criterion for a variation in capacitance is verified, the verification phase (14) comprising steps (140) of measuring the duration of a second predefined sequence of charges/discharges of said capacitive sensor, known as the 'second measurement sequence', and (142) of determining, according to the measured duration, whether a second predefined detection criterion for a variation in capacitance is verified, characterized in that the first measurement sequence is, in the absence of variation in capacitance, of a duration, known as the 'reference duration', less than the reference duration of the second measurement sequence, and in that the verification phase comprises, when the second detection criterion is not verified, a step (144) of updating the first detection criterion.

2. The method (10) as claimed in claim 1, characterized in that, during the step (144) of updating, the first detection criterion is modified when the second detection criterion is not verified during a predefined number of consecutive verification phases.

3. The method (10) as claimed in claim 2, characterized in that, the first detection criterion being verified when the measured duration of the first measurement sequence or when the difference between said measured duration and the reference duration of the first measurement sequence is greater than a threshold value, the modification of said first detection criterion during the verification phase consists in an increase of said threshold value.

4. The method (10) as claimed in claim 2, characterized in that, when the first detection criterion has been modified during the verification phase, the search phase (12) comprises a step (126) of updating said first detection criterion.

5. The method (10) as claimed in claim 4, characterized in that, during the step (126) of updating the search phase (12), the first detection criterion is modified when the previous first detection criterion, used before modification during the verification phase (14), is not verified a predefined number of consecutive times.

6. The method (10) as claimed in claim 5, characterized in that, the first detection criterion being verified when the measured duration of the first measurement sequence or when the difference between said measured duration and the reference duration of the first measurement sequence is greater than a threshold value, the modification of said first detection criterion during the search phase consists in an increase of said threshold value.

7. The method (10) as claimed in claim 1, characterized in that the search phase (12) search step (120) is executed periodically with a period T1, and in that the verification phase (14) measurement step (140) comprises measuring the duration of several second measurement sequences executed periodically with a period T2 less than the period T1, the evaluation of the second detection criterion taking place according to the respective measured durations of the different second measurement sequences.

8. The method (10) as claimed in claim 3, characterized in that, when the first detection criterion has been modified during the verification phase, the search phase (12) comprises a step (126) of updating said first detection criterion.

9. The method (10) as claimed in claim 8, characterized in that, during the step (126) of updating the search phase (12), the first detection criterion is modified when the previous first detection criterion, used before modification during the verification phase (14), is not verified a predefined number of consecutive times.

10. The method (10) as claimed in claim 5, characterized in that, the first detection criterion being verified when the measured duration of the first measurement sequence or when the difference between said measured duration and the reference duration of the first measurement sequence is greater than a threshold value, the modification of said first detection criterion during the search phase consists in an increase of said threshold value.

* * * * *